(12) United States Patent
Hayakawa

(10) Patent No.: US 6,754,880 B2
(45) Date of Patent: Jun. 22, 2004

(54) METHOD FOR AUTOMATICALLY LAYING OUT SEMICONDUCTOR INTEGRATED CIRCUIT

(75) Inventor: Mayumi Hayakawa, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 22 days.

(21) Appl. No.: 10/305,054

(22) Filed: Nov. 27, 2002

(65) Prior Publication Data

US 2003/0101424 A1 May 29, 2003

(30) Foreign Application Priority Data

Nov. 29, 2001 (JP) ........................................ 2001-363814

(51) Int. Cl.[7] .............................................. G06F 17/50
(52) U.S. Cl. ................... 716/8; 716/10; 716/12
(58) Field of Search .............................. 716/8, 10, 12, 716/13

(56) References Cited

FOREIGN PATENT DOCUMENTS

| JP | 11312185 A | * 11/1999 | .......... G06F/17/50 |
| JP | 2001-7209 | 1/2001 | |

* cited by examiner

*Primary Examiner*—Matthew Smith
*Assistant Examiner*—Sun James Lin
(74) *Attorney, Agent, or Firm*—McGinn & Gibb, PLLC

(57) ABSTRACT

The present invention is directed to a semiconductor integrated circuit automatic lay-out method using a cell group constituted of a core cell in which a transistor and/or a logic gate are arranged and a wiring cell through which a power line and an inter-cell signal line between the core cells pass, comprising the steps of using the core cell and the wiring cell in an environment in which the number of grids for the inter-cell signal line is arbitrarily set in initial setting for automatic lay-out; detecting the number of the inter-cell signal lines which pass through the wiring cell of data obtained through cell arrangement and wiring processing; comparing the detected number of the inter-cell signal lines to the number of the initially set grids; and if the number of the grids is excessive or insufficient, replacing an initially set wiring cell with a wiring cell having the detected number of inter-cell signal lines.

9 Claims, 7 Drawing Sheets

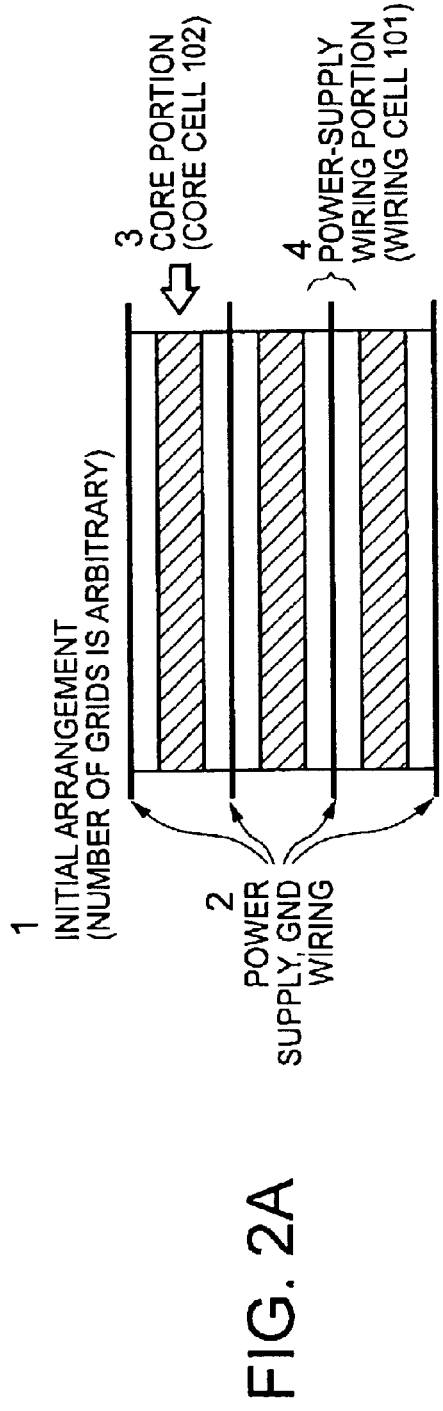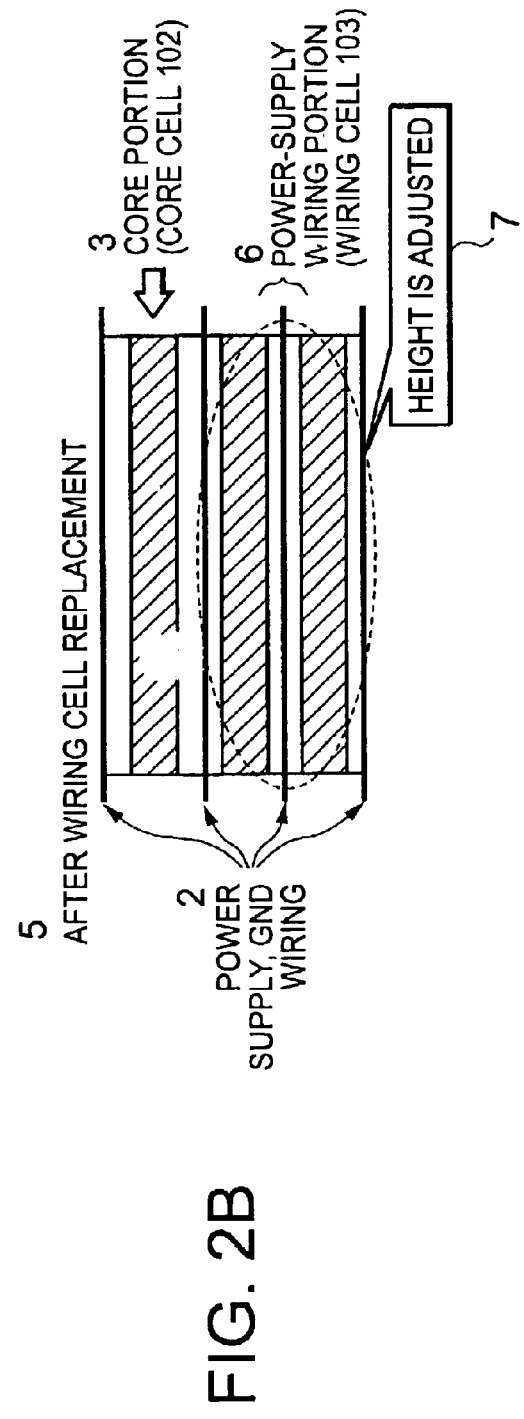
FIG. 2A
FIG. 2B

METHOD FOR AUTOMATICALLY LAYING OUT SEMICONDUCTOR INTEGRATED CIRCUIT

BACKGROUND OF THE INVENTION

1. Field of the Invention

The present invention relates to an automatic lay-out method using a cell group constituted of a minimum cell (hereinafter called core cell) in which a transistor and/or a logic gate are arranged and a passage region cell (hereinafter called wiring cell) through which a power-supply line and an inter-core cell electrical connection signal (hereinafter called inter-cell signal) line pass.

2. Description of the Related Art

Lay-out design of a semiconductor integrated circuit is always accompanied by a requirement for as much reduction in area as possible. In automatic lay-out design by use of a core cell and a wiring cell, a key to reduction in area is how to select a wiring cell containing any given number of grids.

In a lay-out method disclosed in Japanese Patent Application Laid-Open No. 2001-7209, a primitive cell group is used to set two or more of arbitrary numbers of grids to perform a lay-out operation as many times as this set number, to provide a design having a minimum area as final data.

In the case of this lay-out method, however, there coexist in each design a region where an inter-cell signal line passes through densely and that where it passes through sparsely, so that this region where the signal line passes through sparsely may in some cases have an excessive set number of grids therein and so has not been utilized effectively for the purpose of area reduction. This is because by this method only one of various numbers of grids can be set for each design.

Such an area reduction tool is available as to develop a cell construction in a design to reduce a spacing between inter-cell signal lines according to design rules. This processing is performed after converting data obtained as a result of automatic lay-out into data having a different format and cannot be re-converted into the data of an automatic lay-out format.

Therefore, when a design needs to be changed, data obtained as a result of reduction cannot be re-utilized. Furthermore, a cell construction is eliminated, thus increasing time for design check and a required capacity of a processor.

SUMMARY OF THE INVENTION

It is an object of the present invention to provide a semiconductor integrated circuit automatic lay-out method using a cell group constituted of a core cell in which a transistor and/or a logic gate are arranged and a wiring cell through which a power line and an inter-cell signal line between the core cells pass, comprising the steps of using the core cell and the wiring cell in an environment in which the number of grids for the inter-cell signal line is arbitrarily set in initial setting for automatic lay-out; detecting the number of the inter-cell signal lines which pass through the wiring cell of data obtained through cell arrangement and wiring processing; comparing the detected number of the inter-cell signal lines to the number of the initially set grids; and if the number of the grids is excessive or insufficient, replacing an initially set wiring cell with a wiring cell having the detected number of inter-cell signal lines.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIG. 2A and FIG. 2B are arrangement diagrams for cells arranged using a primitive cell group of FIG. 1, and FIG. 2A shows a state of initial arrangement and FIG. 2B shows a state after wiring cells are arranged;

FIG. 5A shows a state before wiring-cell replacement and FIG. 5B shows a state after it;

FIG. 6A shows a state before wiring-cell replacement and FIG. 6B shows a state after it.

DESCRIPTION OF THE PREFERRED EMBODIMENTS

Figure 1:
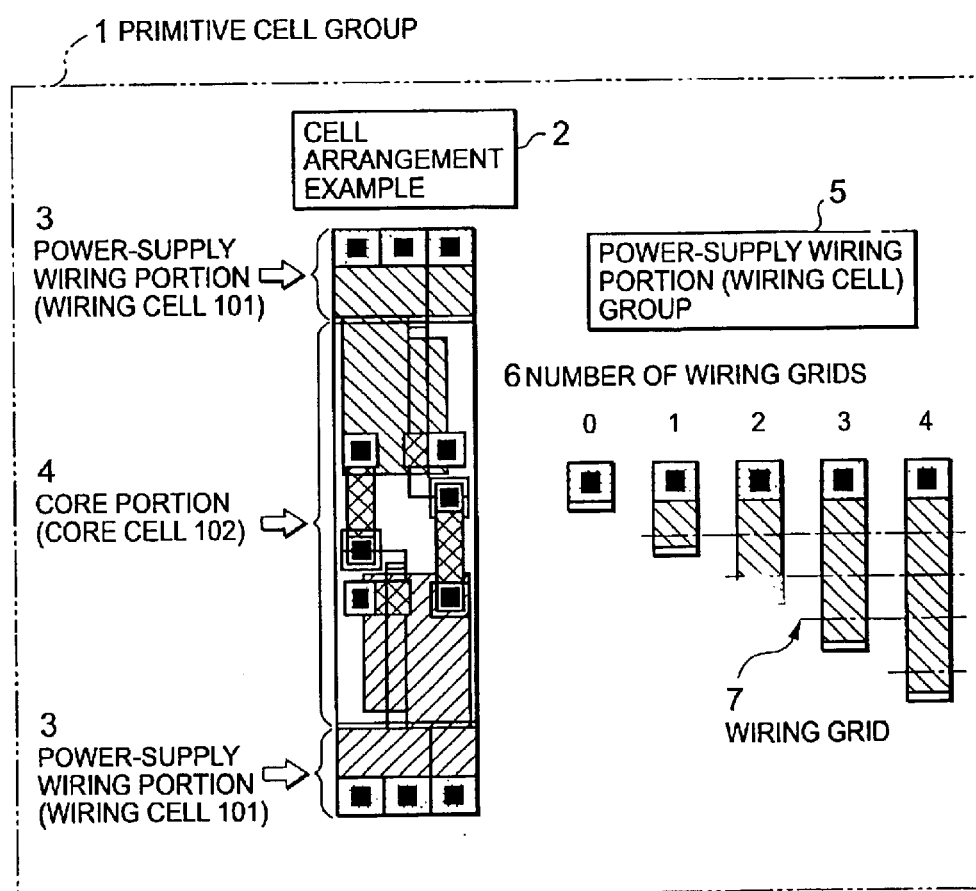
FIG. 1 is an illustration for showing a configuration example of cells in a case where automatic lay-out is performed using a method of an embodiment of the present invention.

FIG. 1 shows a configuration example of cells in a case where automatic lay-out is performed using a method of an embodiment of the present invention.

A primitive cell group is divided into a core portion (core cell 102) in which a logic circuit is made up of transistors etc. and a power-supply wiring portion (wiring cell 101) in which a power-supply line and an inter-cell signal line are arranged. The wiring cell 101 is prepared as many as the number of mutually different numbers of grids, to sandwich the core cell 102 in arrangement. These cells constitute a primitive cell group used in the present invention. The number of grids shown in FIG. 1 is just one example and not restrictive.

An example of cell arrangement by use of the primitive cell group of FIG. 1 is shown in FIG. 2.

In a core portion is there arranged a plurality of the core cells 102 to realize a certain function, above and below which is there arranged the wiring cell 101 having an arbitrary number of grids in arrangement (FIG. 2A).

Only one number of grids can be set in initial setting for each lay-out data item, so that if there occurs a region in which the initially set number of grids is excessive or insufficient depending on density of the core cells 102 or the number of the inter-cell signal lines; by using a method of the present invention, however, this region in which the number of grids is excessive or insufficient can be extracted to then replace an initially set wiring cell 101 with a wiring cell 103 having the number of grids that matches this region (FIG. 2B).

A lay-out method of the present invention has a function to decide whether an arbitrarily set number of grids is excessive or insufficient using such a primitive cell group as described above, a function to calculate the number of grids that is optimal to a region, if any, of such excess or insufficiency, and a function to replace an initially arranged wiring cell with a wiring cell having a calculated number of grids.

Figure 3:
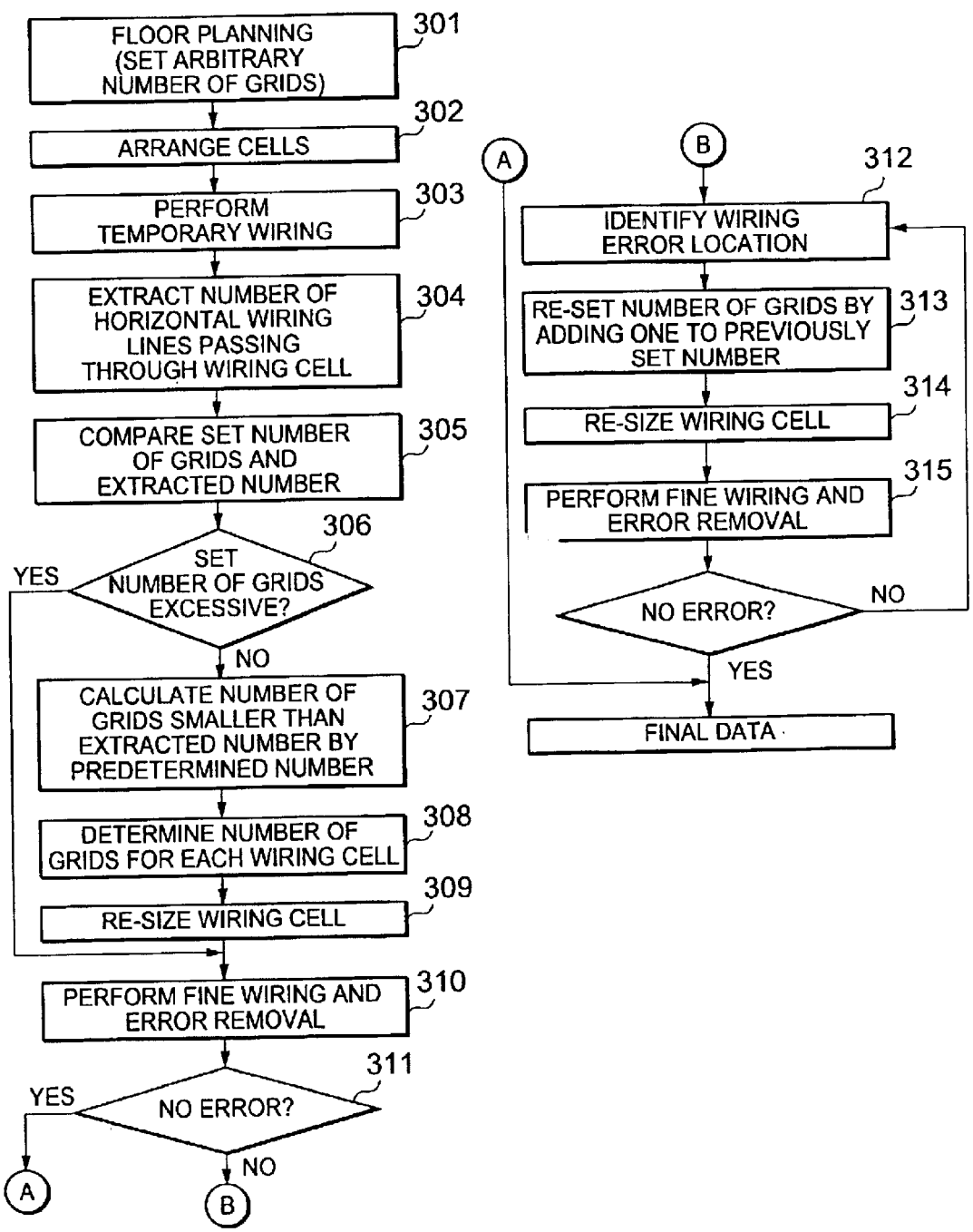
FIG. 3 is a flowchart for explaining procedures of the present invention.

The following will describe operations of the present embodiment with reference to a flowchart of FIG. 3.

At a stage of floor planning for lay-out, the process selects a plurality of wiring cells each containing an arbitrary number of grids (step 301). The process arranges the core cell 102 and the wiring cell 101 to perform connection processing for an inter-cell signal line. This connection processing is actually performed as many times as a selected number of grids (steps 302 and 303).

Based on a result of this processing, the process extracts the number of the inter-cell signal lines passing through the wiring cell of data which has come up with a minimum lay-out area (step 304).

The process compares the set number of grids and the extracted number of the inter-cell signal lines to each other (step 305) and, if the set number of grids is not excessive, immediately performs fine wiring and removes a wiring error (step 310).

If the set number of grids is excessive or insufficient, on the other hand, the process subtracts a predetermined number from the extracted number of grids (step 307). In this case, the predetermined number has been set preferably to three or less but is not restrictive in particular.

The process performs this processing on each of such wiring cells 101 as to have an excessive or insufficient set number of grids (step 308) and replaces them with a wiring cell containing a newly set number of grids (step 309).

In this case, the core cell 102 is not changed in arrangement but moved vertically by replacement of the wiring cells 101. Data thus obtained undergoes fine wiring and wiring error removal (step 310) and, if no error is found, provides final data.

If an error is found, on the other hand, the process identifies a wiring error location (step 312) and newly sets the number of grids which is larger, by one, than the number of grids contained in a wiring cell having this error (step 313) and then replaces this wiring cell with a cell containing the thus re-set number of grids (step 314).

The process performs re-wiring and error removal on the error location and, if no more error is found, provides current data as final data. If another error is found, on the other hand, the process returns to a step of identification of an wiring error location (step 312), to repeat processing described below.

Figure 4:
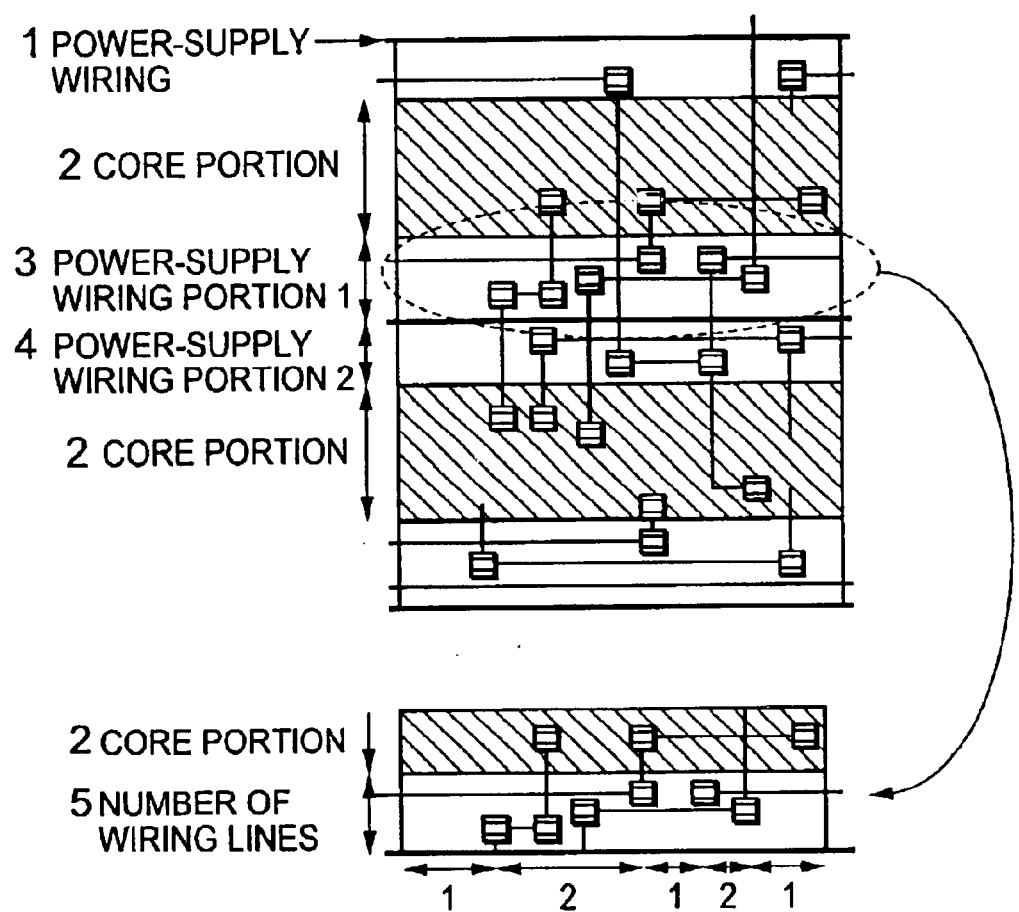
FIG. 4 is an illustration for explaining a method for setting a new number of grids in a case where a set number of grids is excessive or insufficient.

The following will describe a method for setting a new number of grids in a case where a set number of grids is excessive or insufficient, with reference to FIG. 4.

In an arrangement example of FIG. 4, a numerical value of six is set as the number of grids in initial setting (in which power-supply wiring portions 1 and 2 each have three grids), so that extraction of horizontal lines passing through the power-supply wiring portions 1 and 2 comes up with a result of one or two as the number of these horizontal lines. The process calculates a ratio of the number of the horizontal wiring lines being one and two in an area of the power-supply wiring portion 1. The process re-sets the number of grids to the number of the wiring lines which has a ratio of 50% or more in the area.

As a result, in the power-supply wiring portion 1 in FIG. 4, the number of the wiring lines which has a ratio of 50% or more is two, and in the power-supply wiring portion 2, it is one. If no number of the wiring lines which has a ratio of 50% or more can be obtained, the process selects the number of the wiring lines which has a highest ratio as a processing subject.

In this case, the process sets the number of grids which is smaller than a processing-subject number of the wiring lines by about one or two to then perform fine wiring. If an error still remains, to remove it, the process changes setting of the number of grids. The settings given here are just one example and those of the ratio and the number of grids can be changed.

Figure 5:
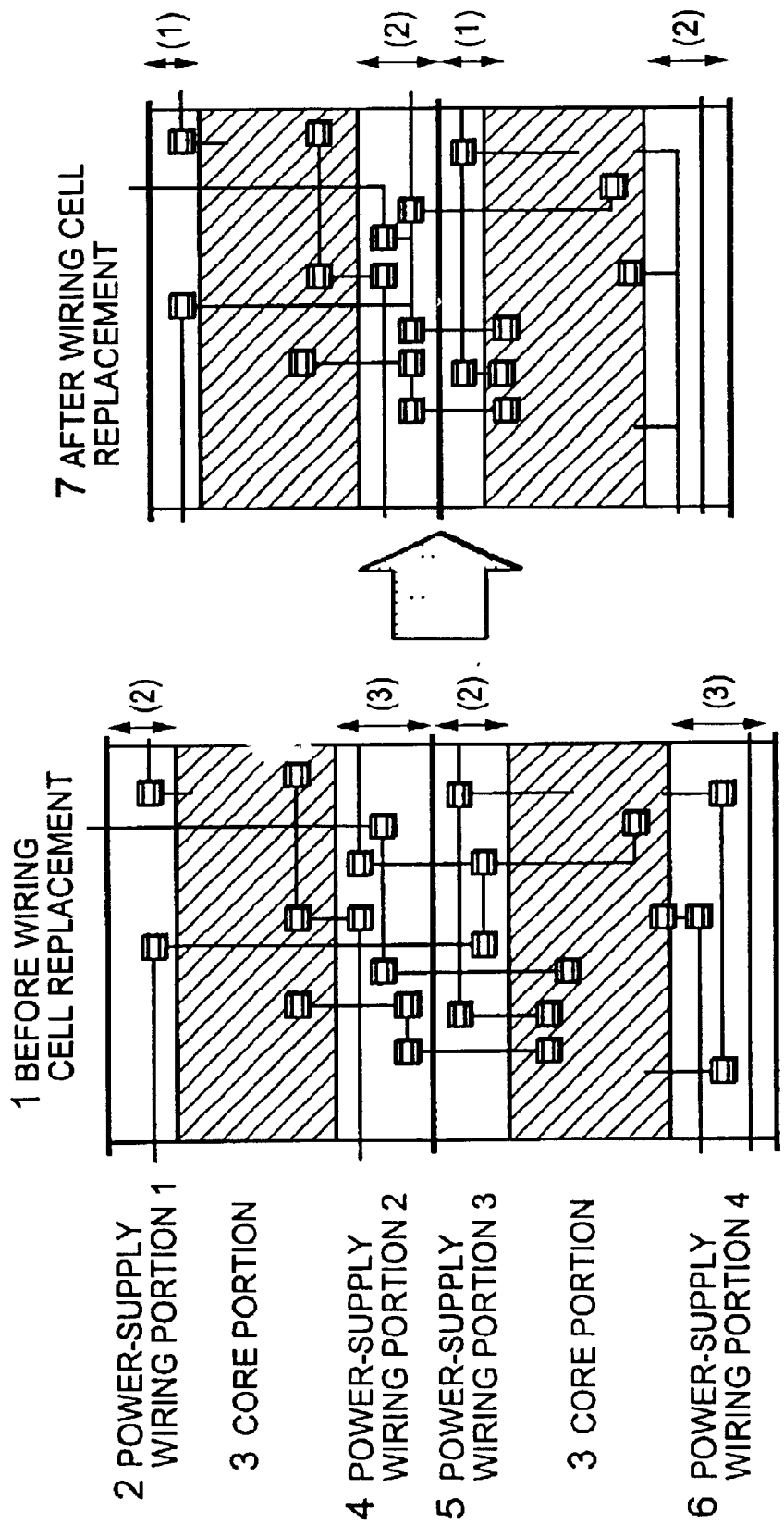
FIG. 5A and FIG. 5B are illustrations for showing a cell arrangement and wiring cell replacement processing on data obtained after temporary wiring.

FIG. 5 shows a cell arrangement and wiring cell replacement processing on data obtained after temporary wiring.

Data before wiring-cell replacement has five as an initially set number of wiring grids (three in the power-supply wiring portions 2 and 4 plus two in the power-supply wiring portions 1 and 3). The process utilizes operations of the present invention to extract horizontal wiring lines passing through the power-supply wiring portions 1, 2, 3, and 4 and re-set the number of grids that matches each of the wiring cell regions; as a result of which, the wiring cells are replaced so that the number of grids may be changed from two to one in the power-supply wiring portion 1, similarly, from three to two in the power-supply wiring portion 2, from two to one in the power-supply wiring portion 3, and from three to two in the power-supply wiring portion 4. As can be seen from FIG. 5, the necessary number of grids before wiring-cell replacement is a total of 10, whereas that after the replacement is a total of six, meaning a reduction of four grids of area in size.

Figure 6:
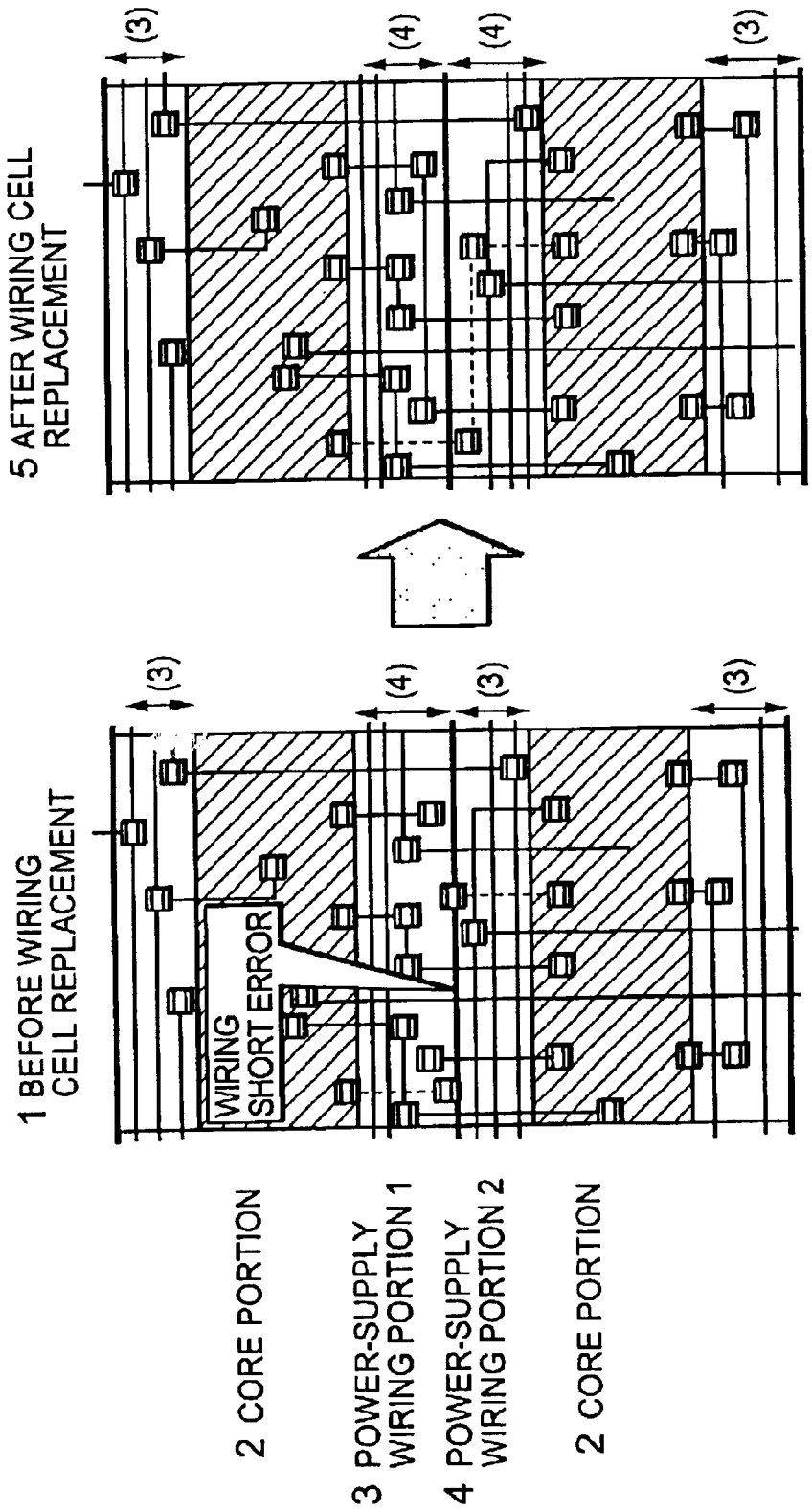
FIG. 6A and FIG. 6B are illustrations for explaining another embodiment of the present invention.

The following will describe another embodiment of the present invention with reference to FIG. 6.

When inter-cell signal line connection processing (wiring processing) is performed, there may occur a spacing error or a short circuit error between one signal line and another or data in a core cell. If such an error cannot be removed in automatic lay-out wiring processing, the error can be removed using a method of the present invention.

Processing of a step of wiring error location identification (step 312) and the subsequent in FIG. 3 corresponds to an error removing procedure according to this method of the present invention. It is also possible to use this method only for error removal. In FIG. 6, a power-supply wiring line and an inter-cell signal line short-circuit with each other at a boundary between the power-supply wiring portions 1 and 2. This short circuit error is located using the present method to then replace the power-supply wiring portion 2 with a wiring cell having one more grid.

Figure 7:
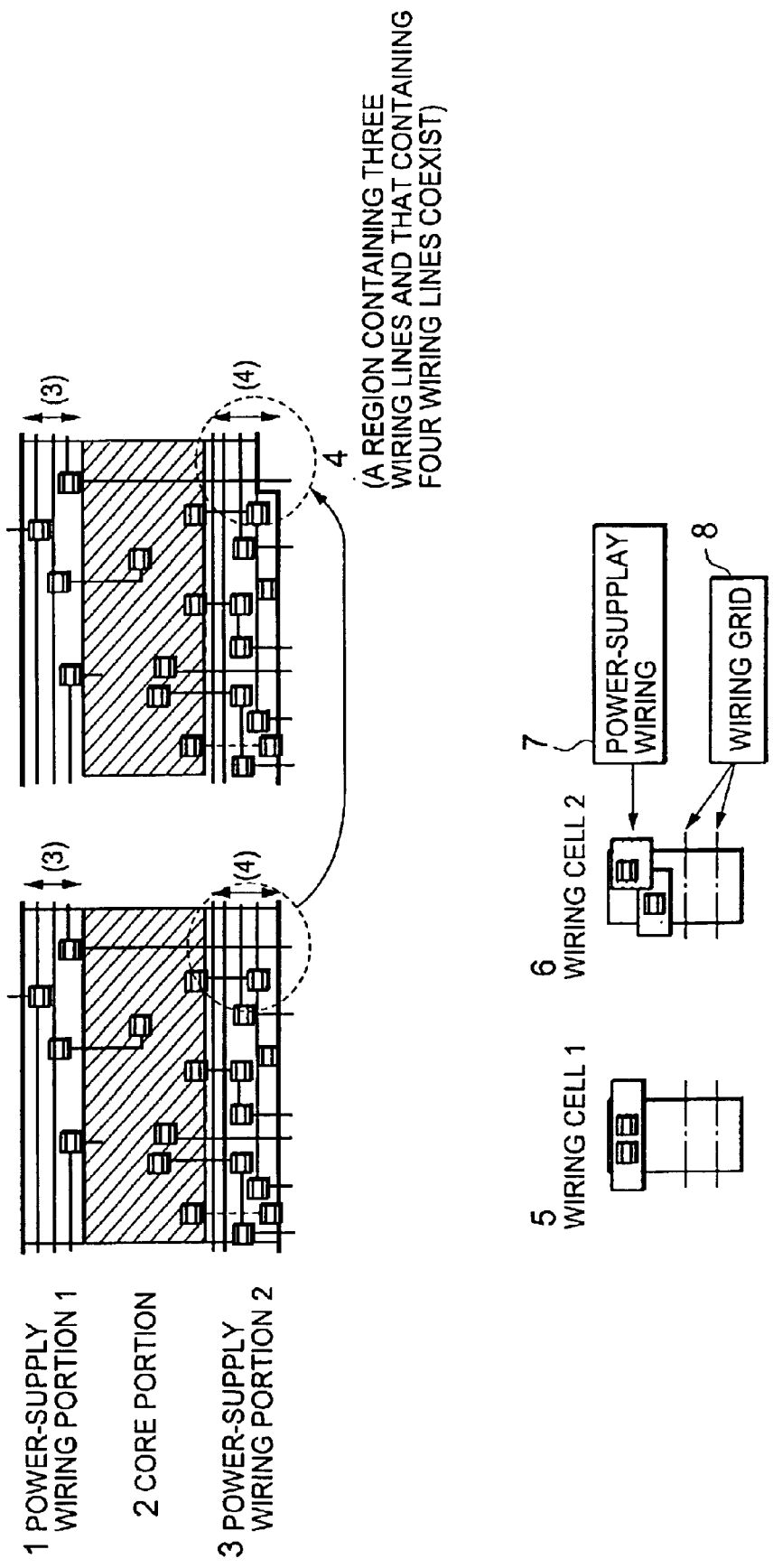
FIG. 7 is an illustration for explaining a further embodiment of the present invention.

The following will describe a further embodiment of the present invention with reference to FIG. 7.

If the cell cannot be reduced in size in the power-supply wiring portion 2 eventually, a region can be specified to reduce the cell in size partially. This is actually possible by preparing, in addition to a wiring cell 1, a wiring cell 2 for connection of a portion where a step has occurred, as power-supply wiring cells in a primitive cell group. Calculation processing performed here is the same as that described above.

By the present invention, it is possible to set the number of wiring grids that matches a region having a low wiring density which has not been utilized by conventional technologies.

Moreover, a chip size can be reduced if a region where core cells and wiring cells are arranged is reduced in area by replacing the wiring cells.

Furthermore, by the present invention, automatic lay-out data undergoes wiring cell replacement and then fine wiring, so that a high-quality (high density) wiring result can be obtained.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor integrated circuit automatic lay-out method using a cell group constituted of a core cell in which a transistor and/or a logic gate are arranged and a wiring cell through which a power line and an inter-cell signal line between the core cells pass, comprising the steps of using the core cell and the wiring cell in an environment in which the number of grids for the inter-cell signal line is arbitrarily set in initial setting for automatic lay-out; detecting the number of the inter-cell signal lines which pass through the wiring cell of data obtained through cell arrangement and wiring processing; comparing the detected number of the inter-cell signal lines to the number of the initially set grids; and if the number of the grids is excessive or insufficient, replacing an initially set wiring cell with a wiring cell having the detected number of inter-cell signal lines.

2. The semiconductor integrated circuit automatic lay-out method according to claim 1, wherein the replacement of said wiring cell is performed in such a manner as to expand or reduce a wiring region.

3. The semiconductor integrated circuit automatic lay-out method according to claim 1, wherein said plurality of core cells are arranged in a core portion in order to realize a predetermined function, and said wiring cell is arranged above and below the core portion in such a manner as to provide an arbitrary number of grids;

a region where the number of grids is excessive or insufficient is extracted; and the initially set wiring cell is replaced with a wiring cell having the number of grids that matches said extracted region.

4. The semiconductor integrated circuit automatic lay-out method according to claim 1, wherein:

whether the arbitrarily set number of grids is excessive or insufficient is decided and, if excess or insufficiency is detected, the number of wiring grids that is optimal to the region in which said excess or insufficiency is detected is calculated; and an initially arranged wiring cell is replaced by a wiring cell having the calculated number of grids.

5. A semiconductor integrated circuit automatic lay-out method using a cell group constituted of a core cell in which a transistor and/or a logic gate are arranged and a wiring cell through which a power-supply line and an inter-cell signal line between the core cells pass, comprising the steps of:

selecting a plurality of the wiring cells each containing an arbitrary number of grids;

arranging the core cell and the wiring cell and performing wiring-line connection processing for inter-cell signal lines for each of the arbitrarily selected number of grids;

extracting the number of the inter-cell signal lines passing through the wiring cell of data that has come up with a minimum lay-out area;

comparing the set number of grids to the extracted number of the inter-cell signal lines;

if said set number of grids is detected to be excessive or insufficient as a result of said comparison, calculating the number of grids which is smaller than the extracted number by a predetermined number;

performing said calculation processing on each of the wiring cells in which said set number of grids is detected to be excessive or insufficient; and replacing each of said wiring cells with a wiring cell containing a newly set number of grids.

6. The semiconductor integrated circuit automatic lay-out method according to claim 5, wherein the replacement of said wiring cell causes said core cell not to be changed in arrangement but to be moved vertically.

7. The semiconductor integrated circuit automatic lay-out method according to claim 5, wherein said predetermined number can be set to three or less.

8. The semiconductor integrated circuit automatic lay-out method according to claim 5, wherein data obtained by the replacement with said wiring cell undergoes fine wiring and wiring error removal and, if no error is detected, is provided as final data.

9. The semiconductor integrated circuit automatic lay-out method according to claim 8, wherein:

if the wiring error is detected, a location of said wiring error is identified to newly set the number of grids which is larger, by one, than the number of grids of the wiring cell where said wiring error is located;

said wiring cell is replaced with a cell containing the re-set number of grids;

re-wiring and error removal are performed on said wiring error location; and if no error is detected, data obtained by the re-arrangement and error removal is provided as final data.

* * * * *